(12) United States Patent
Kawada et al.

(10) Patent No.: US 6,288,368 B1
(45) Date of Patent: *Sep. 11, 2001

(54) VACUUM HEATING FURNACE WITH TAPERED PORTION

(75) Inventors: Hiroki Kawada, Ishioka; Tomoji Watanabe, Tsuchiura; Nobuo Tsumaki, Ushiku; Toshimitsu Miyata, Toyama-ken, all of (JP)

(73) Assignees: Hitachi, Ltd.; Kokusai Electric Co., Ltd., both of Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/547,316

(22) Filed: Apr. 11, 2000

Related U.S. Application Data

(63) Continuation of application No. 09/083,055, filed on May 22, 1998, now Pat. No. 6,093,911.

(30) Foreign Application Priority Data

May 27, 1997 (JP) .................................................... 9-136417

(51) Int. Cl.$^7$ ....................................................... A21B 1/00
(52) U.S. Cl. ......................... 219/405; 219/390; 118/724; 392/416; 573/112

(58) Field of Search ...................................... 219/390, 405, 219/411; 392/416, 418; 118/724, 725, 50.1; 573/112; 110/336; 432/247

(56) References Cited

U.S. PATENT DOCUMENTS 4,411,619  10/1983  Darnell et al. .
5,194,401  * 3/1993  Adams et al. ........................ 437/173

FOREIGN PATENT DOCUMENTS 64-44016   2/1989  (JP) .
2-268420  11/1990  (JP) .
3-67499    3/1991  (JP) .

* cited by examiner

Primary Examiner—Teresa Walberg
Assistant Examiner—Shawntina Fuqua
(74) Attorney, Agent, or Firm—Antonelli, Terry, Stout & Kraus, LLP

(57) ABSTRACT

A vacuum heating furnace comprises a translucent container for retaining a heated object and a heating light source for heating a heated object retained in the translucent container. The translucent container has on its surface a tapered portion to receive transmitted light totally reflected on the inner surface of the translucent container at an angle smaller than a critical angle.

6 Claims, 6 Drawing Sheets

VACUUM HEATING FURNACE WITH TAPERED PORTION

CROSS REFERENCE TO RELATED APPLICATION

This is a continuation of U.S. application Ser. No. 09/083,055, filed May 22, 1998, now U.S. Pat. No. 6,093,911, the subject matter of which is incorporated by reference herein.

BACKGROUND OF THE INVENTION

The present invention relates to semiconductor equipment or semiconductor devices and an apparatus for manufacturing semiconductor devices, and particularly to a vacuum heating furnace in which a treated object retained within a chamber is treated by heating or the like.

As an apparatus for manufacturing semiconductors and semiconductor devices, heretofore, there is a vacuum heating furnace in which a silicon semiconductor wafer retained within a quartz chamber is heated by radiation heat radiated by a lamp or a heater from the outside of the chamber and an oxide film layer is deposited on the surface of the semiconductor wafer by introducing oxygen gas into the chamber.

In the semiconductor element or semiconductor device, in order to reduce an electric power consumed when the semiconductor element or semiconductor device is operated or in order to improve an operating speed by suppressing a calorific value, it is requested that the semiconductor element should be microminiaturized. Recently, a technology for microminiaturizing semiconductor elements makes a rapid progress, and there is an increasing demand of further microminiaturizing the semiconductor elements. Also, a semiconductor device having a new structure such as a flash memory has appeared, and is now commercially available on the market. With respect to these new semiconductor devices, there is still an increasing demand of increasing a memory area. To meet with these requirements, it is requested that an oxide film on a semiconductor wafer should have a thickness as very thin as about several nanometers.

To this end, a temperature at which the semiconductor wafer is heated should be very high in a range of from about 900° C. to 1000° C. or higher. At the same time, it is necessary to reduce a time for heating the semiconductor wafer as much as possible. That is during the time when the semiconductor wafer is heated at a rising temperature, the process for depositing the oxide film continues, thereby making it difficult to deposit a thin homogeneous oxide film on the semiconductor wafer.

Therefore, in order to heat a semiconductor wafer in a period of time as short as possible, it is customary that a semiconductor wafer is directly heated by the irradiation of radiation light emitted from a halogen lamp or a heater, for example, from the outside of a quartz chamber. According to this technology, although energy of radiation light is contained in infrared rays of light having a wavelength of about 2 to 3 $\mu$m, light of this wavelength is not absorbed by quartz which is a material of the quartz chamber. Thus, the radiation light cannot heat the quartz. Having passed the quartz chamber, the radiation light reaches the semiconductor wafer, in which it is absorbed, thereby resulting in the semiconductor wafer being heated.

However, when this radiation light passes the quartz chamber, the radiation light is propagated through the quartz material while a part of the radiation light is being reflected on the surface of the quartz, and reaches a portion distant from a light incident point. That is, it was understood that the quartz chamber plays a role of an optical waveguide.

Then, light that passed the inside of the material of the quartz chamber heats and deteriorates an assembly mounted on the surface of the quartz chamber.

For example, in order to seal the quartz chamber in the vacuum state, an O-ring made of a high-molecular compound such as a fluororubber is used as a connection portion which is connected to another chamber. The reason for this is that a soft and flexible material such as a high-molecular compound should be used to seal a material such as a quartz which tends to be cracked. However, it is to be noted that such a soft and flexible material is generally not satisfactory in heat-resisting property. A heat-resisting property of the above-mentioned high molecular compound is such one that the high molecular compound is denatured at a temperature up to about 300° C. at most. If the high molecular compound is heated at a temperature higher than the above-mentioned temperature, then the quality of the material of the high molecular compound is deteriorated, and hence cannot be used to seal the quartz chamber in the vacuum state.

JP-A-2-268420 describes a technology in which a part of quartz chamber is made opaque in order to reduce light transmitted through the inside of the quartz chamber. According to this conventional technology, a part of a furnace tube which is the quartz chamber is made of an opaque quartz, whereby light transmitted through that opaque quartz portion to the O-ring is shielded. Similarly, JP-A-3-67499 describes a technology in which a part of quartz tube is made of an opaque material in order to prevent light radiated from plasma generated in the inside of the quartz tube from propagating the inside of the quartz tube to heat the O-ring.

Furthermore, JP-A-64-44016 describes a technology in which a transmitted light shielding plate is embedded into the inside of the material of the quartz tube.

However, if a chamber is made of a quartz material and an opaque quartz material, then there arises a problem that a mechanical strength of the chamber is weakened.

Showing an example in which physical characeristics of quartz and opaque quartz are compared with each other, a viscosity of quartz glass is 400 GPa·s or a transparent quartz at 1200° C. and 74 GPa·s for an opaque quartz. A compressive strength of a rod-like test sample having a diameter of 24 mm at a room temperature is 1130 Mpa for a transparent quartz and 268 Mpa for an opaque quartz. Further, at a room temperature, a bending strength of a transparent quartz is 46.5 Mpa and that of an opaque quartz is 15.8 Mpa. A temperature in which a flexibility occurs as a viscosity is lowered with an application of heat during a long period of time is 1100° C. for a transparent quartz and 1050° C. for an opaque quartz. As described above, mechanical strengths of the two materials are different from each other considerably.

To make one chamber, two materials should be jointed by a suitable method such as welding or bonding. In the above-mentioned conventional technologies, there have not yet been considered such problems in which a stress occurs in the joint portion of the two materials having different mechanical strengths due to a difference of physical property so that, when the joint portion is heated at an increasing temperature, the joint portion is cracked or an internal stress is accumulated.

Specifically, by using different materials, it is very difficult to make a furnace body in which a semiconductor wafer is heated at a temperature which increases rapidly from a strength reliability stand-point. Further, it is needless to say that, if the whole of the chamber is made of the opaque quartz, then light may not reach the semiconductor wafer retained within the opaque quartz chamber.

Although a technology in which the mounted portion of the O-ring is cooled by a suitable method such as a water cooling, there is a limit in cooling the mounted portion of the O-ring by a heat conduction, which hinders a lamp or a heater from increasing its output power.

Furthermore, when a water cooling pipe or the like is laid, a leakage water countermeasure also becomes necessary. There arise problems from an equipment cost standpoint and a production cost standpoint.

When the very thin oxide film is deposited on the semiconductor wafer by rapidly heating the semiconductor wafer, there still remain the problems as described above. As a result, the output of the heater cannot be increased and a temperature rise speed is limited, which as a result imposes a restriction on making the oxide film very thin. Even though the performance of the flash memory or the like is considerably affected by various factors such as a thickness of an oxide film and a homogeneity of a film quality, it is unavoidable that a device performance is limited by the above-mentioned problems.

SUMMARY OF THE INVENTION

In view of the aforesaid aspect, it is an object of the present invention to provide a vacuum heating furnace in which light transmitted through the inside of a chamber from a heater is radiated to the outside of a chamber material and a part of or the whole of energy of light which reaches an O-ring can be reduced or completely eliminated.

It is another object of the present invention to provide a vacuum heating furnace in which an output of a heater can be increased while an O-ring can be prevented from being heated and deteriorated by transmitted light so that a temperature at which a treated semiconductor wafer is heated can be increased, a thickness of a treated film can be reduced very much and that a semiconductor device of a higher efficiency can be produced.

It is a further object of the present invention to provide a vacuum heating furnace in which a lid of a chamber or a heating furnace can be made of the same material, e.g. a transparent quartz so that a strength of the chamber or the lid can be increased, thereby making the vacuum heating furnace highly-reliable.

It is yet a further object of the present invention to provide a vacuum heating furnace in which a manufacturing cost can be reduced.

In order to achieve the above-mentioned objects, according to the present invention, there is provided a vacuum heating furnace which comprises a container for retaining a semiconductor and a light source disposed outside the container for heating the semiconductor retained within the container. The vacuum heating furnace includes the protruded portion which is formed on the surface of the container for radiating light emitted from the light source.

Further, the above-mentioned protruded portion includes the surface which is inclined relative to the surface of the container. Furthermore, the protruded portion is formed on the flange provided on the container or the rib-like assembly provided on the container.

Furthermore, the inclined surface of the flange may include any of inclination angles greater than 3° and smaller than 87° relative to the surface of the container when the quartz chamber is used. Alternatively, the rib-like assembly may include the rectangular cross-section, and the end face of the rib-like assembly may include the surface of the container and the surface inclined at the inclination angle greater than 46.5° and smaller than 87°. Alternatively, the protruded portion may include the triangular cross-section, the surface of the container and the surface inclined with the inclination angle greater than 46.5° and smaller than 87°.

DESCRIPTION OF THE PREFERRED EMBODIMENTS

The present invention will now be described in detail with reference to the drawings.

Figure 1:
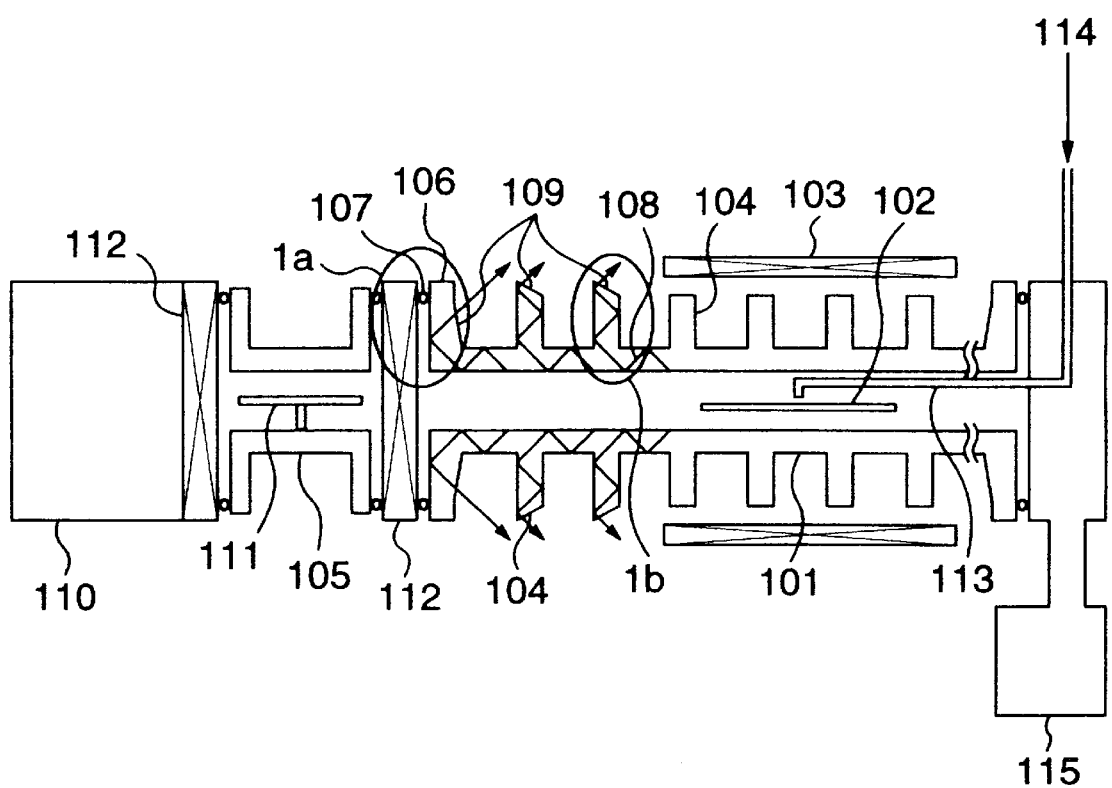
FIG. 1 is a diagram showing a vacuum heating furnace according to an embodiment of the present invention.

FIG. 1 of the accompanying drawings is a longitudinal cross-sectional view illustrating a vacuum heating furnace according to an embodiment of the present invention, and showing, in particular, the case in which a quartz chamber is used as a heating furnace for heating a semiconductor wafer.

As shown in FIG. 1, a semiconductor wafer 102 inserted through a semiconductor wafer introducing tube 110 is conveyed by a conveying mechanism 111 into a quartz chamber 101 through a joint chamber 105. The quartz chamber 101 and the joint chamber 105; and the joint chamber 105 and the semiconductor wafer introducing chamber 110 are partitioned from each other by a gate valve 112, respectively. A process gas 114 is introduced into the quartz chamber 101 from a process gas introducing tube 113 and the semiconductor wafer 102 is treated by heating. The inside of the quartz chamber 101 is exhausted by an exhaust pump 115, and the process gas 114 also is exhausted by the exhaust pump 115.

The quartz chamber 101 has a cross section of substantially rectangular shape. Because the heater 103 should be located as close as possible to the semiconductor wafer 102 in order to rapidly heat the semiconductor wafer 102, a clearance between the surface of the semiconductor wafer 102 and the inner surface of the quartz chamber 101 is small, and the cross section of the quartz chamber 101 is oblong rectangular.

The quartz chamber 101 may be evacuated in order to depressurize itself before or during the treatment or in order to introduce a special gas. A rib 104 is welded to the outer surface of the quartz chamber 101 as a reinforcing member in order to protect the quartz chamber 101 from being broken by an outside pressure. The rib 104 is made of a plate material similarly to the quartz chamber 101, for example. If the height of the rib 104 would not be sufficiently large, a necessary strength could not be obtained. Thus, the height of the rib 104 is generally made larger than the width thereof.

The semiconductor wafer 102 that has been treated within the quartz chamber 101 is conveyed to another chamber in such a manner that a gas is not introduced into the quartz chamber 101 from the outside, and then conveyed for the next treatment. To this end, the quartz chamber 101 is jointed in an airtight fashion to the joint chamber 105 made of a different material. Therefore, a flange portion 106 is provided with an O-ring 107 and this O-ring 107 is urged between the quartz chamber 101 and the joint chamber 105, thereby resulting in the quartz chamber 101 being made airtight. The flange portion 106 is made of a plate material and welded to the furnace body.

The semiconductor wafer 102 is heated by light radiated from the heater 103. As mentioned before, at that time, a part of light 108 that has transmitted through the quartz chamber 101 passes the quartz chamber 101 and heats the O-ring 107, thereby resulting in the O-ring 107 being deteriorated. Therefore, the material of the O-ring 107 is requested to have a heat-resisting property, a chemical stability and a softness for protecting the quartz from being damaged. As the material of the O-ring 107, there is generally used a fluororubber.

As will be described with reference to the arrangements of the flange portions 1a, 1b in FIG. 1, the vacuum heating furnace according to this embodiment is arranged such that the transmitted light 108, which was transmitted through the inside of the quartz chamber 101 to heat the O-ring 107, is radiated from tapered portions 109 to the outside. This outside is the outside of the material of the quartz chamber 101. Hence, the transmitted light 108 may be radiated not only to the outside of the quartz chamber 101 but also to the inside of the quartz chamber 101, i.e. to the vacuum side.

Figure 2:
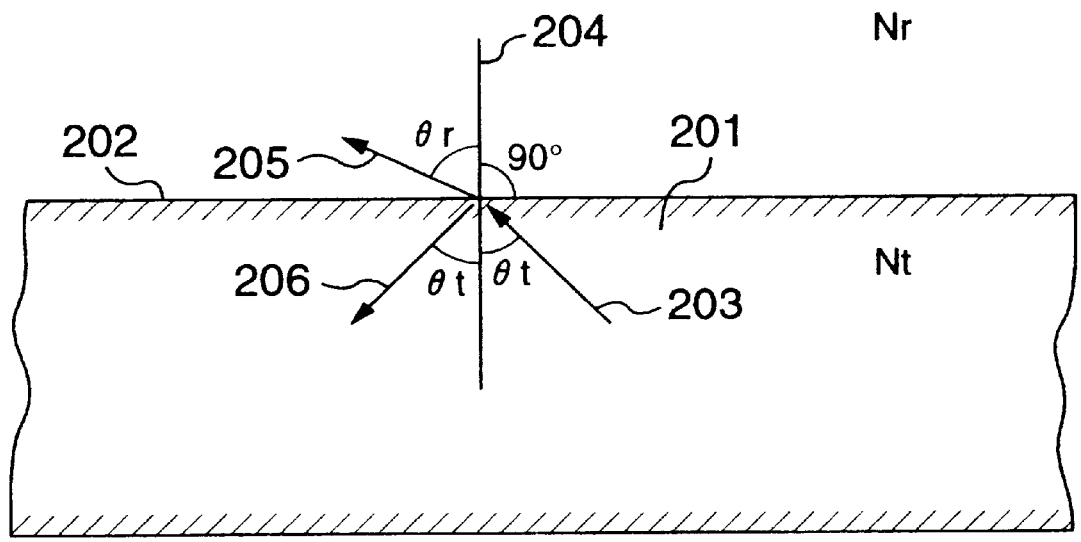
FIG. 2 is a diagram showing the direction in which light is internally reflected and transmitted through a material such as a quartz.

FIG. 2 is a diagram showing the direction in which light is internally reflected and transmitted through a material such as a quartz. As shown in FIG. 2, in the inside of a material 201, θt assumes an angle formed between incident light 203 on an interface 202 and a normal 204 of the interface 202, and θr assumes an angle formed between light 205 transmitted through the interface 202 and which travels to the outside of the material 201 and the normal of the interface. The conditions of refraction and reflection in the interfaces of two different media are known as Snell's law, in which an angle formed between reflected light 206 on the interface 202 and the normal 204 of the interface becomes θt. Further, Nt assumes a refractive index of the material 201 and Nr assumes a refractive index of a medium outside the material. Then, a critical angle of total reflection in which energy of light incident at an angle larger than an angle at which light incident on the interface 202 is totally reflected is totally reflected satisfies the following equation (1):

$$\theta t > \theta c = \arcsin(Nr/Nt) \quad (1)$$

Figure 4:
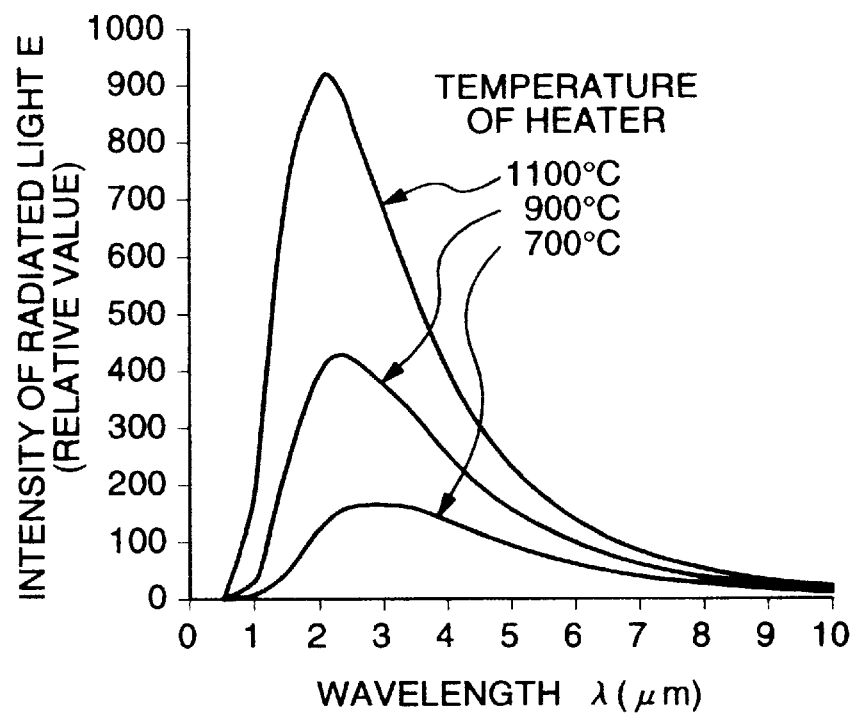
FIG. 4 is a graph graphing the manner in which an intensity of radiation light is changed as a wave-length λ of radiation light is changed when a temperature of a heater is used as a parameter.
Figure 5:
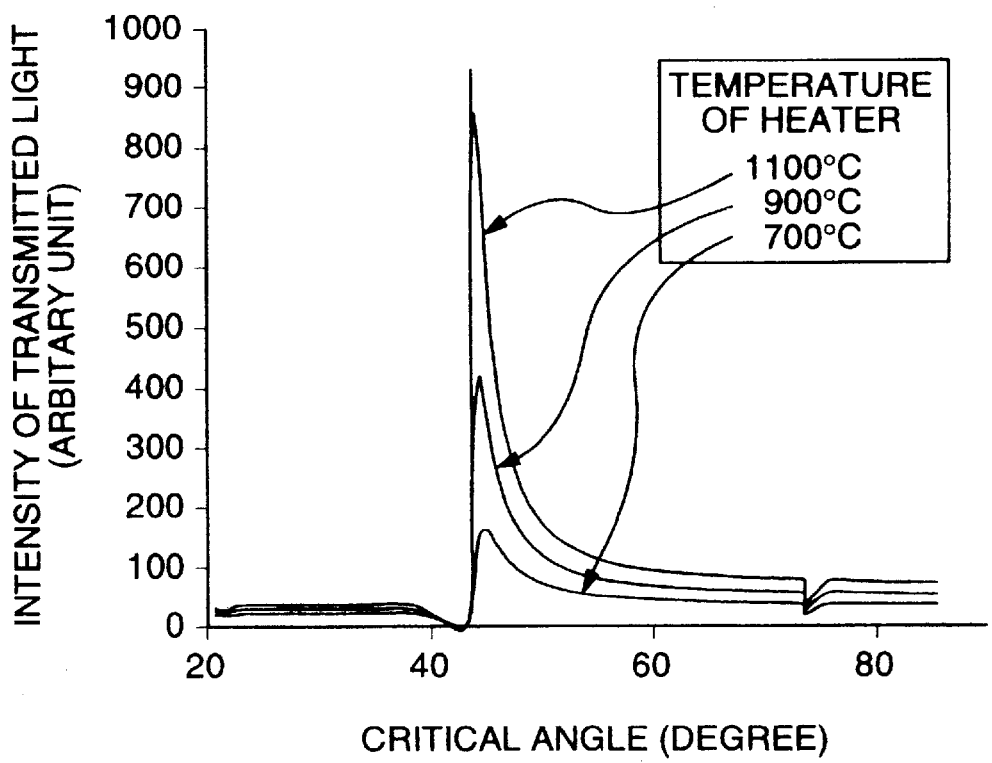
FIG. 5 is a graph graphing the manner in which an intensity of light transmitted through the inside of the quartz is changed as a critical angle in the quartz is changed.

The critical angle θc obtained when the material is the quartz will be described with reference to FIGS. 3 to 5.

Figure 3:
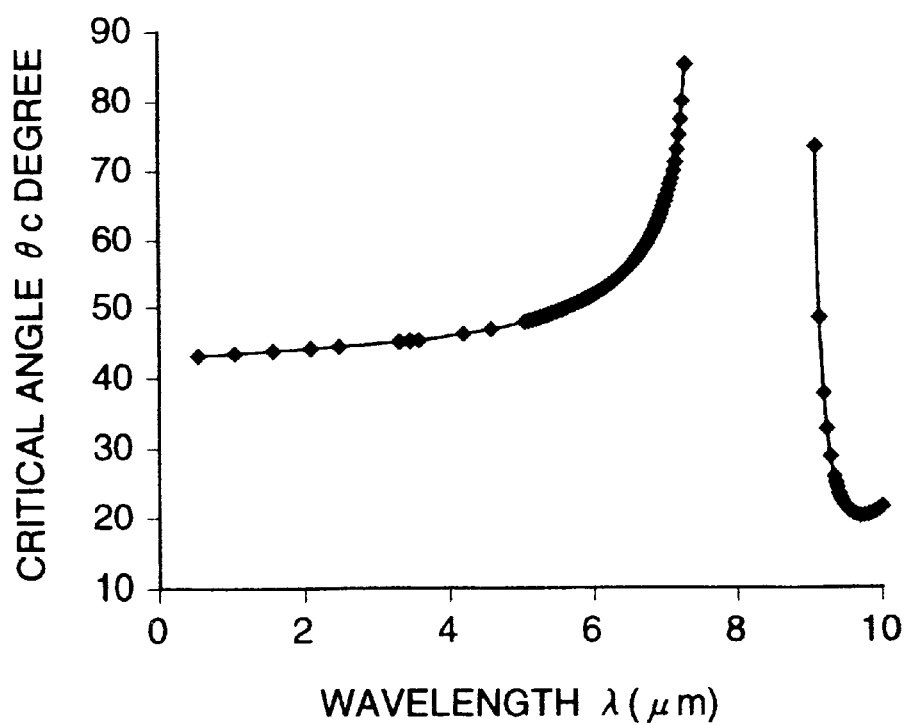
FIG. 3 is a graph graphing the manner in which critical angle θc in a quartz is changed with a wave-length λ.

FIG. 3 is a graph graphing measured results obtained when the critical angle θc in the quartz was changed as a wave-length λ is changed. FIG. 4 is a graph graphing measured results obtained when an intensity of radiation light was changed in accordance with the change of a wave-length λ of radiation light while a temperature of a heater is used as a parameter. FIG. 5 is a graph graphing measured results obtained when an intensity of light transmitted through the inside of the quartz was changed as the critical angle was changed.

The quartz is the material which is generally used in a heating treatment furnace of semiconductor equipment. The refractive index Nt of quartz in the equation (1) is changed depending upon the wave-length λ of light. Accordingly, by substituting a refractive index of quartz in each wave-length λ into the Nt of the above-mentioned equation (1), it is possible to calculate the critical angle θc at every wave-length B. FIG. 3 shows the critical angle θc obtained at every wavelength λ.

On the other hand, light transmitted through the inside of the quartz is light radiated from the heater, and an intensity thereof is changed at every wavelength λ of radiation light. FIG. 4 shows an intensity E of radiation light measured at every temperature of the heater. This radiation light is a heat ray transmitted through the inside of the quartz.

The above-mentioned two results can be combined by the wave-length λ of light. That is, at every critical angle θc, there can be obtained an intensity of heat ray transmitted through the inside of the quartz. FIG. 5 is a graph showing this relationship. Study of the graph of FIG. 5 reveals that, in the light transmitted through the inside of the quartz, a value of a critical angle in which most of energy of light can be radiated can be determined by radiating light incident on the quartz at an angle larger than a predetermined value to the outside of the quartz. In the present invention, this value of the critical angle is determined as 43.5°, for example. As shown on the above-mentioned equation (1), by radiating light incident on the interface at an incident angle larger than the predetermined value from the inside of the quartz to the outside of the quartz, it is possible to considerably reduce energy of light transmitted through the inside of the quartz.

The above description has been applied so far to the case of the semiconductor equipment using the quartz chamber and the heating heater. It is needless to say that, even when the chamber is made of a material other than quartz or even when an intensity of light at every wave-length λ has a distribution different from those of the above-mentioned graphs, it is possible to obtain critical angles of every material of the chamber by a similar method.

When it is considered that light propagating the inside of the material of the chamber consists of a component propagating in the direction from the heater 103 to the O-ring 107, i.e. in the transverse direction of the quartz chamber 101 and a component propagating in the direction perpendicular to the sheet of drawing of FIG. 1, i.e. in the direction perpendicular to the transverse direction of the quartz chamber 101, these components can be considered independently. The reason for this is that the component propagating in the direction perpendicular to the transverse direction cannot reach the O-ring 107 from a proceeding direction standpoint and does not contribute to the heating of the O-ring 107.

Accordingly, it is clear that there should be considered only the component of the transmitted light 108 propagating in the direction of the O-ring 107. Accordingly, when the manner in which light is transmitted through the inside of the material of the chamber is described, there will be used a cross-sectional view illustrating the chamber 101 in FIG. 1 taken along the transversal direction of this chamber.

The specific arrangement of the chamber in the vacuum heating furnace according to this invention will be described with reference to FIGS. 6 to 9.

Figure 6:
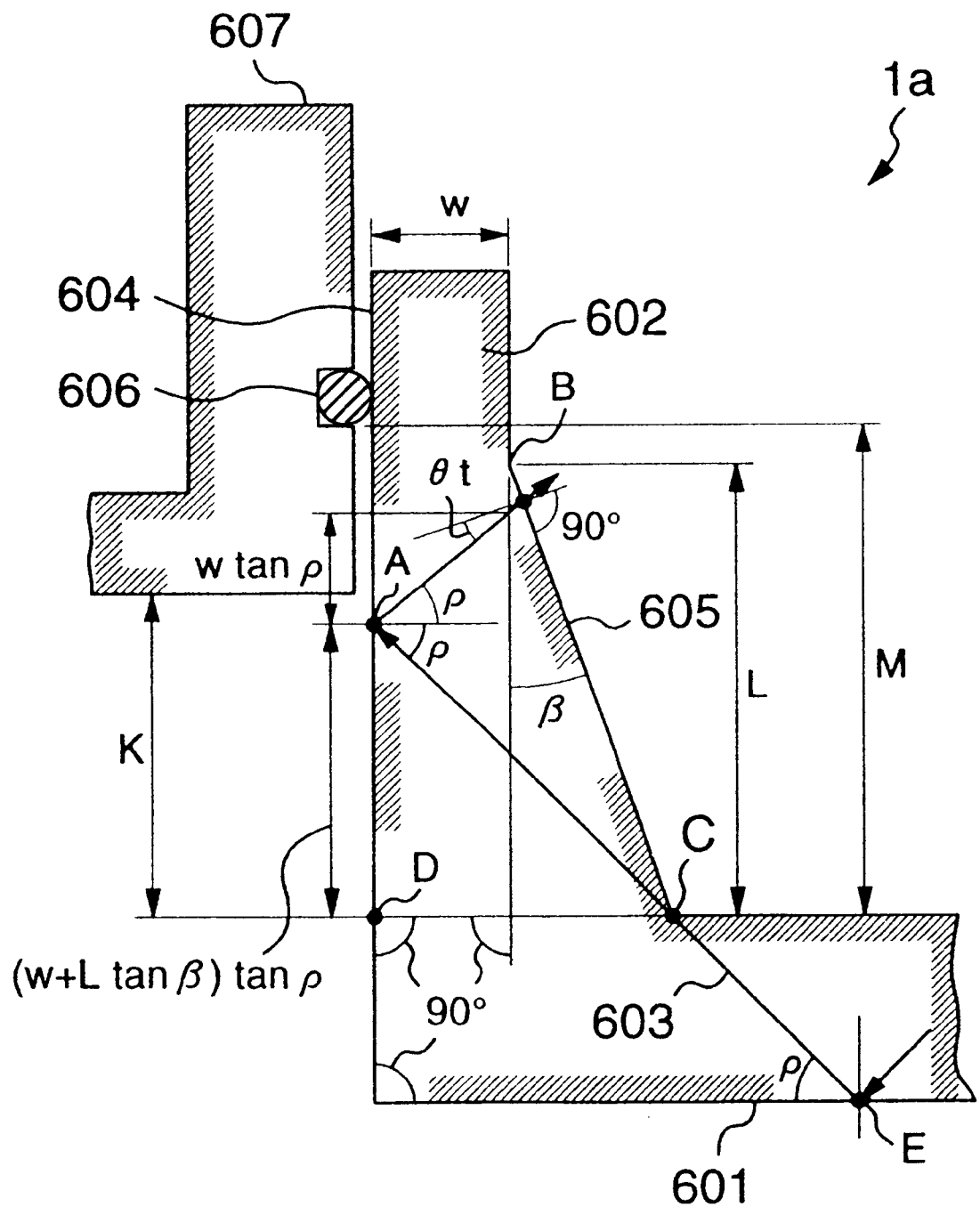
FIG. 6 is a longitudinal cross-sectional view illustrating a flange portion 1a of the vacuum heating furnace shown in FIG. 1 in an enlarged scale.

FIG. 6 is a longitudinal cross-sectional view illustrating the flange portion 1a in FIG. 1 in an enlarged scale. FIG. 6 shows a cross section of a flange portion 602 formed at the end of a chamber 601. The flange portion 1a is formed by welding the flange portion 602 made of the same quartz to the chamber 601. In general chambers, since the sheet surface of the flange portion is vertical to the chamber, this shape will be described in the embodiment of the present invention. Even when an attachment angle is different, the following technology can be applied without difficulty, and there can be achieved similar effects.

As shown in FIG. 6, transmitted light 603 propagating through the inside of the chamber 601 repeats the internal reflection on the surface of the chamber 601.

Let us describe a structure in which transmitted light proceeding in the direction of any angle can be prevented from reaching an O-ring 606. As shown in FIG. 6, transmitted light entered from the right-hand side of the chamber 601 is internally reflected on the inner surface (lower side of FIG. 6) or the outer surface of the chamber 601, and reaches a sheet surface 604.

Accordingly, initially, let us consider transmitted light which reaches the sheet surface 604 after it had been internally reflected on the inner surface of the chamber 601. If one of the internal reflection point is set to a point E, then owing to the above-mentioned law of reflection, only light which satisfies $\rho<90°-\theta c$ is internally reflected and transmitted toward the flange portion 602. These light beams become incident on the sheet surface 604 of the flange portion 602 and become incident on the normal at the angle $\rho$. Of these light beams, only light beam which satisfies $\rho>\theta c$ is internally reflected on the sheet surface 604, and transmitted toward a tapered portion 605 of the opposite side. A countermeasure for light which is not internally reflected but radiated to the outside will be described later on.

The tapered portion 605 is the convex portion which forms an angle $\beta$ relative to the sheet surface 604. Assuming that $\theta c$ is the incident angle on the tapered portion 605, there is then obtained a range in which the incident angle $\theta t$ of transmitted light 603 which reaches the tapered portion 605 is changed. On the other hand, if the internal reflection is prevented from being caused in the tapered portion 605, then the transmitted light 603 can be prevented from reaching the O-ring 606. From the above, it is clear that $\beta$ is determined so as to satisfy the following equation (2):

$$90°-2\theta c<\beta<2\theta c \quad (2)$$

Incidentally, although a size of the tapered portion 605 should be determined in such a manner that all transmitted light beams which had been internally reflected on the sheet surface 604 may reach the tapered portion 605, this will be described later on.

In the quartz, if $\theta c=43.5°$, then energy of light transmitted through the chamber can be reduced considerably as mentioned before. If this is applied to the above-mentioned equation, then we have:

$$3°<\beta<87° \quad (3)$$

That is, if the tapered portion 605 is formed in such a manner that the angle $\beta$ falls within this range, then transmitted light reached the tapered portion 605 from the chamber 601 cannot be reflected internally therein and fully radiated to the outside.

If the length L of the tapered portion 605 in FIG. 6 is too short, then all of light beams reflected on the sheet surface 604 cannot be radiated. As shown in FIG. 6, of light beams transmitted toward the tapered portion 605 after they had been reflected on the sheet surface 604, an outermost light beam. i.e. a light beam which reaches the O-ring 606 should become incident on the tapered portion 605. To this end, a relationship between the width W of the flange portion 602 and the length L of the tapered portion 605 should fall within a proper range. For example, when L assumes a distance between a point B at which the tapered portion 605 is erected from the back surface of the flange portion 602 and the outer surface of the chamber 601, if the following equation (4) is satisfied:

$$L>W\times\tan(\rho)+(W+L\times\tan(\beta))\times\tan(\rho) \quad (4)$$

the above-mentioned action can be achieved.

Since the angle $\rho$ on the right-hand side of the above-mentioned equation (4) changes in the above-mentioned range of $\rho>\theta c$, considering the case that this angle $\rho$ takes an upper limit value, the above-mentioned equation (4) yields the conditions expressed as:

$$\beta<\arctan[\cot(\theta c)] \quad (5)$$

$$L<2W/(\cot(\theta c)-\tan(\beta)) \quad (6)$$

These are the conditions of $\beta$ and L necessary for radiating all of light beams transmitted through the chamber 601 from the tapered portion 605. In this connection, in the quartz, since energy of transmitted light can be considerably reduced by setting the critical angle $\theta c$ to the above-mentioned value, if this value is substituted into the above-mentioned equations (5) and (6), then we have the following equation (7):

$$\beta<46.5° \text{ and } L<2W/(1.1-\tan(\beta)) \quad (7)$$

Further, in FIG. 6, if the O-ring 606 is fitted into the inside of the flange 602 too deep, i.e. the diameter of the O-ring 606 is too small, there is then the possibility that propagating light from the chamber 601 will directly reach the contact point of the O-ring 606. Therefore, if M is a distance between the inner periphery of the O-ring 606 and the outer surface of the chamber 601, then it is to be geometrically understood that the following equation (8) should be satisfied:

$$M>(W+L\times\tan(\beta))\times\tan(\rho) \quad (8)$$

Furthermore, like a point A in FIG. 6, although a part of light beams incident on the sheet surface 604 is not reflected but transmitted, these transmitted light beams are reflected on the surface of the joint chamber 607 and then introduced into the flange portion 602 one more time. To avoid this disadvantage, the surface of the connection chamber 607 may be treated by an anti-reflection treatment. Alternatively, if a distance K between the inner periphery of the joint chamber 607 and the outer surface of the chamber 601 is set in a range expressed by the following equation (9):

$$K>(W+L\times\tan(\beta))\times\tan(\rho) \quad (9)$$

Then, the attachment position of the joint chamber 607 to the sheet surface 604 is properly determined and the joint chamber 607 can be placed in such a manner that light radiated from the chamber 601 or the flange portion 602 to the outside can be prevented from being introduced again into the chamber 601 and the flange portion 602.

Considering the case that the angle ρ on the right-hand side of the above-mentioned two equations (8) and (9) takes an upper limit value, there are established the following equations (10) and (11):

$$M > (W + L \times \tan(\beta)) \cot(\theta c) \quad (10)$$

$$K > (W + L \times \tan(\beta)) \cot(\theta c) \quad (11)$$

In this connection, if the critical angle θc of the quartz is set to 43.5°, then there can be established the following equations (12) and (13):

$$M > 1.1(W + L \times \tan(\beta)) \quad (12)$$

$$K > 1.1(W + L \times \tan(\beta)) \quad (13)$$

As described above, if the shapes of the flange portion 602 and the tapered portion 605 are determined, then it becomes possible to radiate the transmitted light 603 to the outside of the chamber 601. Accordingly, while the O-ring 606 can be suppressed from being heated by the transmitted light 603, the semiconductor wafer can be heated up to a high temperature in a short period of time.

Furthermore, since the chamber can be made of the same material, e.g. transparent quartz, it is possible to prevent the chamber from being cracked or broken due to heat generated at the contact surface in which different materials are brought in contact with each other unlike the case in which the opaque quartz is used.

While the transmitted light 603 is radiated to the atmosphere side in the embodiment of FIG. 6, the present invention is not limited thereto, and the tapered portion 605 may be disposed at the position distant from the contact position at which the sheet surface 604 contacts with the joint chamber 607 and the transmitted light 603 may be radiated to the vacuum side with similar effects being achieved.

Figure 7:
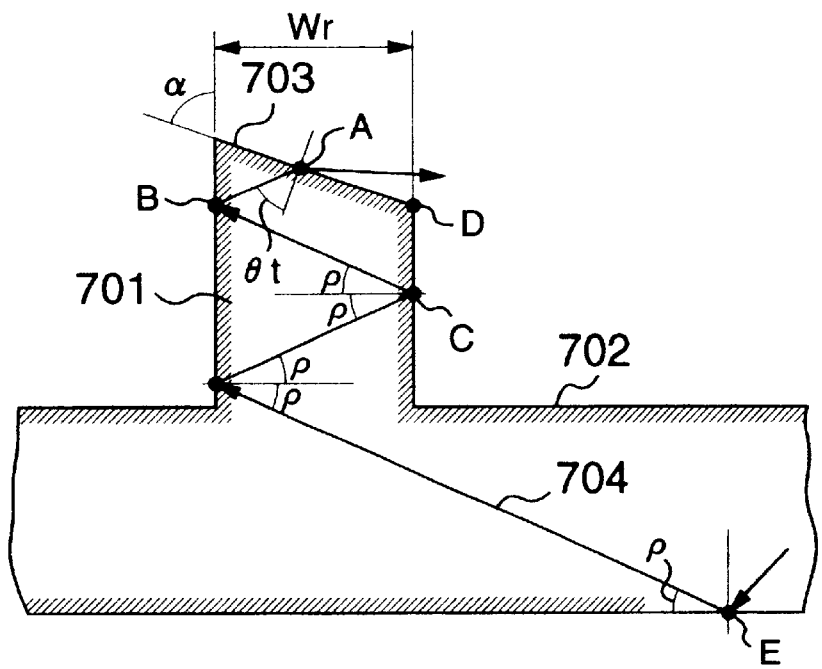
FIG. 7 is a cross-sectional view illustrating a flange portion 1b of the vacuum heating furnace shown in FIG. 1 in an enlarged scale and illustrates, in particular, a rib structure for radiating light introduced into the rib from the rib to the outside according to the embodiment of the present invention.

Another embodiment in which transmitted light is radiated from the rib in the flange portion 1b shown in FIG. 1 will be described next. FIG. 7 is a cross-sectional view illustrating the embodiment of the rib structure in which transmitted light introduced into the rib is radiated from the rib to the outside in the vacuum heating furnace according to the present invention.

For example, when a rib has a rectangular cross-section and one surface thereof is welded to the surface of the chamber, a part of light introduced from the chamber to the rib is repeatedly reflected internally and returned to the inside of the material of the chamber. However, according to the following shape, it is possible to radiate all of light beams introduced into the rib.

As shown in FIG. 7, a rib 701 is welded to a plate-like chamber 702 in cross section, and a tapered surface 703 having an angle a is formed at the tip end of the rib 701.

Transmitted light 704 propagated through the chamber 701 from the right-hand side of FIG. 7 is repeatedly reflected internally on the surface of the chamber 702.

A structure in which any transmitted light introduced into the inside of the rib 701 after it has been propagated from the right-hand side can be prevented from being returned into the chamber 702 from the rib 701 one more time will be described hereinafter.

For example, if the point E is selected as one of internal reflection points, owing to the aforementioned law of reflection, only light which satisfies ρ<90°−θc is internally reflected and transmitted to the rib 701. These light beams are initially introduced into the side surface of the rib 701 and then introduced into the normal at the angle ρ. Of these light beams, light which satisfies ρ>θc is internally reflected and transmitted to the side surface of the opposite side. After this operation is repeated, transmitted light is transmitted to the upper surface of the rib 701, i.e. the tapered portion 703 in FIG. 7. The range of this angle ρ is the same as the above-mentioned range.

Any transmitted light is separated into transmitted light introduced from the left-hand side of FIG. 7 and transmitted light introduced from the right-hand side as will be described later on with reference to FIG. 8. Let us describe the case in which any transmitted light is radiated at the tapered portion to the outside.

Initially, the case of FIG. 7 will be described. As shown in FIG. 7, the tapered portion 703 is the convex portion which forms an angle a relative to the left-hand side surface of the rib 701. If θt is the incident angle to this tapered surface, then there can be obtained a range in which the incident angle θt of transmitted light 704 reached the tapered portion 703 is changed. On the other hand, in order to prevent the internal reflection from being caused in the tapered portion 703, it is sufficient that θt falls within a range of −θc<θt<θc. If this condition is satisfied, then light introduced into the tapered portion 703 is radiated to the outside and is not internally reflected so that light transmitted to the O-ring can be reduced. In order to satisfy this equation by θt, the angle α is determined in a range of −θc<α+θc−90° and a range of α−θc<θc. Thus, the following equation (14) is established:

$$-\theta c - 2\theta c < \alpha < 2\theta c \quad (14)$$

Further, a case in which reflected light introduced into the rib from the right-hand direction and which is reflected from the right-hand side surface of the rib 701 is directly introduced into the tapered surface in the structure of FIG. 7 will be described with reference to FIG. 8. In FIG. 8, transmitted light 704 into the rib 701 is introduced into the tapered surface 703 and reached the point A. If θt is the incident angle obtained at that time and θu is the incident angle of light which was transmitted to the left-hand side surface of the rib 701 after it had been internally reflected at the point A, then in order to prevent the internal reflection from being caused in the left-hand side surface of the rib 701, the incident angle θu in the above-mentioned equation may fall within a range of −θc<θu<θc. In order for the incident angle θu to satisfy this equation, the angle α may be determined so as to satisfy the following equation (15) in a range of −θc<90°+θc−2α and 180°−θc−2α<θc:

$$90° - \theta c < \alpha < 45° + \theta c \quad (15)$$

Figure 8:
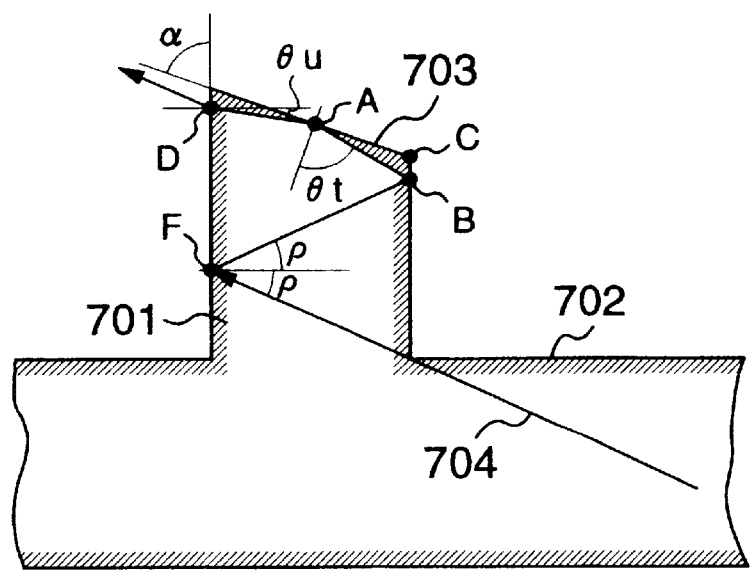
FIG. 8 is a cross-sectional view illustrating the case of different incident light directions in the flange portion 1b of the vacuum heating furnace shown in FIG. 7.

In order to radiate any of transmitted light beams, which were treated in FIGS. 7 and 8, from the rib to the outside, the equations (14) and (15) should be established simultaneously. In the quartz, if the critical angle θc is set to 43.5°, then the ranges of 3°<α<87° and 46.5<α<88.5° are obtained. In order to establish the above-mentioned inequalities simultaneously, the angle α of the tapered portion is determined so as to satisfy the following inequality (16):

$$46.5° < \alpha < 87° \quad (16)$$

As a consequence, transmitted light reached the tapered portion from the chamber cannot be internally reflected but radiated to the outside. Thus, most of energy of transmitted light can be prevented from reaching the O-ring, and hence the heating of the O-ring by the transmitted light can be reduced.

Figure 9:
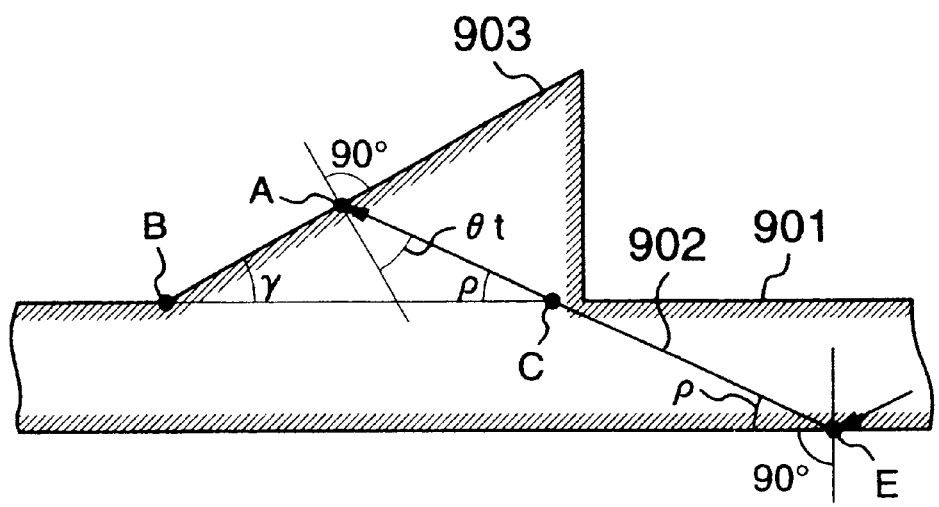
FIG. 9 is a diagram showing a vacuum heating furnace having a rib whose cross-section is triangular according to other embodiment of the present invention.

The rib structure having the parallel side surfaces has been described so far. According to a rib having a triangular cross-section in which an inclined surface is formed at the opposite side of the heater as shown in FIG. 9, it is possible to achieve similar effects. FIG. 9 is a diagram showing a rib having a triangular cross-section according to other embodiment of the present invention.

Transmitted light 902 propagated through the inside of a chamber 901 in FIG. 9 is repeatedly reflected internally on the surface of the chamber 901. If one of the internal reflection points is selected as the point E, owing to the law of reflection, only transmitted light which satisfies $\rho<90°-\theta c$ is internally reflected. A tapered portion 903 is a convex portion which forms an angle $\gamma$ relative to the surface of the chamber 901. If $\theta t$ is an angle at which transmitted light becomes incident on the tapered portion 903, then a proper range of $\gamma$ is calculated by a consideration similar to the above-mentioned one, and the angle $\gamma$ may be determined so as to satisfy $90°-\theta c<\gamma<2\theta c$ in a range of $-\theta c<\theta c-\gamma$ and in a range of $90°-\gamma<\theta c$. Further, in the quartz, if the critical angle $\theta c=43.5°$, there can be obtained a range of y which satisfies $46.5°<\gamma<87°$.

That is, if the tapered portion 903 is provided in such a manner that the angle $\gamma$ falls within the above-mentioned range, then the transmitted light 902 cannot be internally reflected thereon but radiated therefrom to the outside. As a result, most of energy of light can be prevented from reaching the O-ring, and the heating of the O-ring by the transmitted light can be suppressed. Thus, it is possible to heat the semiconductor wafer at a high temperature in a short period of time.

When a quartz material is used not as the chamber but as a lid of another chamber, the lid itself can be relatively easily produced by a machine work. Thus, unlike the rib welded to the chamber, it is possible to widen a width of an uneven shape from which transmitted light is radiated. Further, if the lid of the chamber is made of a quartz, the chamber and the lid can be formed as a unitary-body structure so that a strength can be increased further as compared with the case in which the rib is bonded to the chamber, thereby making the heating furnace highly reliable. Even when the original effect of the rib for increasing a strength is not necessary, it is possible to form a rib in order to radiate light, which heats the O-ring, to the outside.

Figure 10:
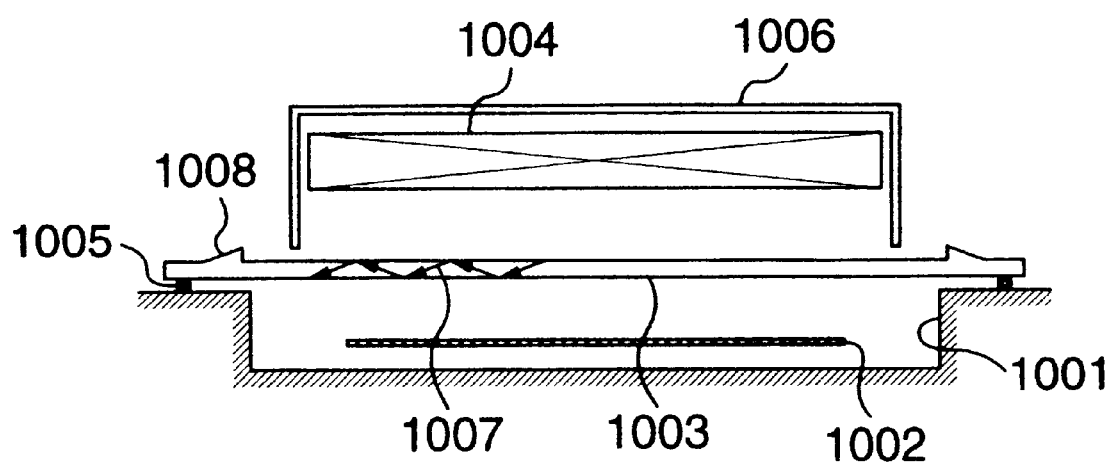
FIG. 10 is a diagram showing a vacuum heating furnace according to a further embodiment of the present invention.

FIG. 10 is a diagram showing a vacuum heating furnace according to a further embodiment of the present invention. A treated semiconductor wafer 1002 is retained a chamber 1001, and a lid 1003 made of a quartz plate, for example, is disposed on the chamber 1001. Light from a heater 1004 is shielded by a heater cover 1006 in such a manner that it may irradiate the portion of an O-ring 1005. The space between the chamber 1001 and the lid 1003 is kept air-tight by the O-ring 1005, and light radiated from the heater 1004 is irradiated to heat the semiconductor wafer 1002 through the transparent lid 1003. However, a part of light is propagated through the inside of the lid 1003 as transmitted light 1007 to heat the O-ring 1005, thereby the O-ring 1005 being deteriorated as already mentioned. In the prior art, the heating of the O-ring can be prevented by cooling the portion in which the chamber 1001 and the O-ring 1005 are brought in contact with each other. There then arise the problems from a manufacturing cost standpoint and a maintenance cost standpoint.

Therefore, a protruded portion 1008 is formed near the O-ring 1005 in order to prevent the O-ring 1005 from being heated by the transmitted light 1007 in the lid 1003. As the shape of the protruded portion 1008, there can be used a rib the cross-section of which is triangular as shown in FIG. 9, for example. According to this arrangement, since the transmitted light introduced from the lid 1003 to the protruded portion 1008 is radiated from the protruded portion 1008 to the outside, the transmitted light 1007 which reaches the O-ring 1005 can be shielded effectively, and the heating of the O-ring 1005 can be prevented. Further, since the lid can be made of the same material, e.g. transparent quartz, it is possible to prevent the occurrence of crack or break due to heat generated at the contact surface in which different members are brought in contact with each other like the case in which the opaque quartz is used. Through FIGS. 7 to 10, the rib and the tapered portion are provided in the atmosphere side so that transmitted light can be radiated to the atmosphere side. However, the tapered portion need not always be provided in the atmosphere side but may be provided in the vacuum side to radiate transmitted light to the vacuum side with similar effects being achieved. Further, while the shape of the protruded portion 1008 is the triangular rib as described above, the present invention is not limited thereto, and a tapered portion on which light, which had been totally reflected on the inner side surface of the chamber, becomes incident at an angle smaller than a critical angle may be provided.

Further, while the chamber is made of the quartz, by way of example, which is generally used in the vacuum heating furnace in the above-mentioned embodiments, the present invention is not limited thereto. Having considered the refractive index at every wave-length of other materials and determined proper tapered angle and structure, it is to be understood that other materials can be used with similar effects being achieved.

Further, while the light radiated from the heater has been described so far in the above-mentioned embodiments, the present invention is not limited thereto, and can be applied to the case in which light radiated from plasma generated in the inside of equipment such as a plasma etching system is internally reflected within a quartz tube and thereby propagated to heat and deteriorate an O-ring. Specifically, in the above-mentioned embodiments, as shown in FIG. 4, the tapered angle is calculated by using an intensity distribution based on the wave-length of the light radiated from the heater but instead, if an intensity distribution based on a wave-length of light radiated from plasma is used, then by similar calculations, there can be determined a tapered angle for radiating light radiated from plasma to the outside of the material of the chamber and a structure of such tapered portion.

According to the above-mentioned embodiments, in the vacuum heating furnace, light transmitted through the inside of the chamber after it has been radiated from the heater is radiated to the outside of the material of the chamber. As a consequence, a part of or the whole of energy of light which reaches the O-ring or the like can be reduced or completely eliminated.

Therefore, since the output of the heater can be increased without being restricted by the deterioration of the O-ring due to heat from transmitted light, a temperature increasing speed of a treated semiconductor wafer can be increased, a treated film can be made very thin, and much more highly-efficient devices can be produced.

Furthermore, since the chamber or the lid of the heating furnace can be made of the same material, e.g. transparent quartz, it is possible to make semiconductor equipment highly-reliable by increasing the strength of the chamber or the lid. In addition, it is possible to reduce a manufacturing cost.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. In a vacuum heating furnace comprising a translucent container for retaining therein a heated object and a heating light source for heating said heated object retained in said translucent container, said vacuum heating furnace characterized in that said translucent container has a tapered portion formed on a surface of said translucent container so as to emit transmitted light totally reflected on an inner surface of said translucent container at an angle smaller than a critical angle.

2. A vacuum heating furnace as claimed in claim 1, wherein said translucent container includes a reinforcing rib made of the same material as that of said translucent container, said reinforcing rib being protruded to the outside of said translucent container and said tapered portion is formed at a protruded end of said reinforcing rib.

3. A vacuum heating furnace as claimed in claim 1, wherein said translucent container has flanges formed at both ends in a longitudinal direction of said translucent container, and said tapered portion is formed on said flanges.

4. A vacuum heating furnace as claimed in claim 1, wherein said translucent container has at least one rib having a cross-section which is a triangle formed on an outer side surface of said translucent container, and one side of said triangle constructs said tapered portion.

5. A vacuum heating furnace comprising a translucent container for retaining therein a heated object and a heating light source for heating said heated object retained in said translucent container, said vacuum heating furnace characterized in that said translucent container has a tapered portion formed on a surface of said translucent container so as to emit transmitted light totally reflected on an inner surface of said translucent container at an angle smaller than a critical angle;

wherein said translucent container extends in a longitudinal direction and has end portions, said tapered portion being disposed so as to direct the transmitted light totally reflected on the inner surface of said translucent container in a direction outwardly from said translucent container and away from an end surface thereof.

6. A vacuum heating furnace as claimed in claim 5, wherein said heating light source is arranged outside of said translucent container and said transmitted light totally reflected on the inner surface of said translucent container is directed by said tapered portion in a direction of said heating light source.

* * * * *